(12) United States Patent
Hakunti et al.

(10) Patent No.: US 7,742,309 B2
(45) Date of Patent: Jun. 22, 2010

(54) ELECTRONIC DEVICE AND METHOD OF ASSEMBLING AN ELECTRONIC DEVICE

(75) Inventors: Jussi Hakunti, Turku (FI); Pekka Kilpi, Helsinki (FI); Anssi Vänskä, Helsinki (FI); Teppo Aapro, Vantaa (FI); Harri Lasarov, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/647,613

(22) Filed: Dec. 29, 2006

(65) Prior Publication Data

US 2008/0158825 A1  Jul. 3, 2008

(51) Int. Cl.
*H05K 5/00* (2006.01)
(52) U.S. Cl. .................................. 361/752; 361/748
(58) Field of Classification Search .............. 361/760, 361/720, 736, 748; 174/258–259, 110 R, 174/117 A; 257/723, 678
See application file for complete search history.

(56) References Cited

U.S. PATENT DOCUMENTS

| | | | | |
|---|---|---|---|---|
| 4,855,868 A | * | 8/1989 | Harding | ...................... 361/704 |
| 5,285,104 A | * | 2/1994 | Kondo et al. | ................. 257/666 |
| 6,191,360 B1 | * | 2/2001 | Tao et al. | ..................... 174/522 |
| 6,683,250 B2 | * | 1/2004 | Luettgen et al. | ............. 174/544 |
| 6,768,654 B2 | * | 7/2004 | Arnold et al. | ............... 361/818 |
| 6,849,800 B2 | * | 2/2005 | Mazurkiewicz | ............. 174/394 |
| 2003/0019647 A1 | | 1/2003 | Luettgen et al. | ............ 174/52.1 |
| 2006/0003137 A1 | * | 1/2006 | Amstutz et al. | ............... 428/68 |
| 2006/0018098 A1 | | 1/2006 | Hill et al. | ..................... 361/708 |
| 2006/0170092 A1 | * | 8/2006 | Kim et al. | .................... 257/690 |
| 2006/0221591 A1 | | 10/2006 | Kong | .......................... 361/818 |
| 2008/0080141 A1 | * | 4/2008 | Krokoszinski et al. | ...... 361/709 |
| 2009/0004557 A1 | * | 1/2009 | Lasarov et al. | .............. 429/122 |

FOREIGN PATENT DOCUMENTS

| | | |
|---|---|---|
| EP | 1065916 A2 | 1/2001 |
| GB | 2418539 A | 3/2006 |
| WO | WO2006-017484 A1 | 2/2006 |

* cited by examiner

*Primary Examiner*—Hung S Bui
(74) *Attorney, Agent, or Firm*—Harrington & Smith

(57) ABSTRACT

An electronic device and method of assembling an electronic device, said device including an electronic component; an electrically insulating protective layer overlaying and in contact with at least a portion of the electronic component; and injection molded material overlaying at least the portion of the component and the overlaying protective layer.

20 Claims, 5 Drawing Sheets

ELECTRONIC DEVICE AND METHOD OF ASSEMBLING AN ELECTRONIC DEVICE

FIELD OF THE INVENTION

Embodiments of the present invention relate to an electronic device and method of assembling an electronic device. In particular they relate to an electronic device having an injection molded cover.

BACKGROUND TO THE INVENTION

In recent years there has been a trend to reduce the thickness of electronic devices. Problems arise during the formation of the covers of thin electronic devices. The covers are commonly formed by injection molding and the conditions required for injection molding, i.e. the high temperature of the material and the force with which the injection molded material enters the mold, may damage sensitive electronic components.

Therefore it is advantageous to produce a way of assembling an electronic device without damaging the electronic components and without increasing the thickness of the device.

BRIEF DESCRIPTION OF THE INVENTION

According to one embodiment of the invention there is provided an electronic device comprising: an electronic component; an electrically insulating protective layer overlaying and in contact with at least a portion of the electronic component; and injection molded material overlaying at least the portion of the electronic component and the overlaying protective layer.

This provides the advantage that the electronic component is protected by the overlaying protective layer and is thus able to withstand the injection molding process. Thus the injected molded material can be overlaying and in close proximity to the protective layer thereby reducing the overall thickness of the device.

The protective layer may also be thermally conductive. This may also provide the further advantage that it prevents the electronic component from over heating in use as it can conduct heat generated away from the electronic component.

In embodiments of the invention the electronic component may be mounted on a mechanical substrate before injection molding. This provides an advantage in that the mechanical substrate provides mechanical support and acts as a heat sink to transfer heat away from the electronic component during injection molding.

According to another embodiment of the invention there is provided a method of assembling an electronic device comprising electronic components, the method comprising: forming an electrically insulating protective layer over at least a portion of an electronic component, where the protective layer overlays and is in contact with at least a portion of the electronic component; forming a molded layer over at least the portion of the electronic component and the overlaying protective layer by injection molding.

According to a further embodiment of the invention there is provided a method of assembling an electronic device comprising: attaching a printed circuit board to a substrate; injection molding over the printed circuit board; wherein the substrate forms part of the electronic device.

BRIEF DESCRIPTION OF THE DRAWINGS

For a better understanding of the present invention reference will now be made by way of example only to the accompanying drawings in which.

DETAILED DESCRIPTION OF EMBODIMENTS OF THE INVENTION

The Figures illustrate an electronic device 1 comprising: an electronic component 5; an electrically insulating protective layer overlaying and in contact with at least a portion of the electronic component 5; and injection molded material overlaying at least the portion of the electronic component 5 and the overlaying protective layer.

Figure 1:
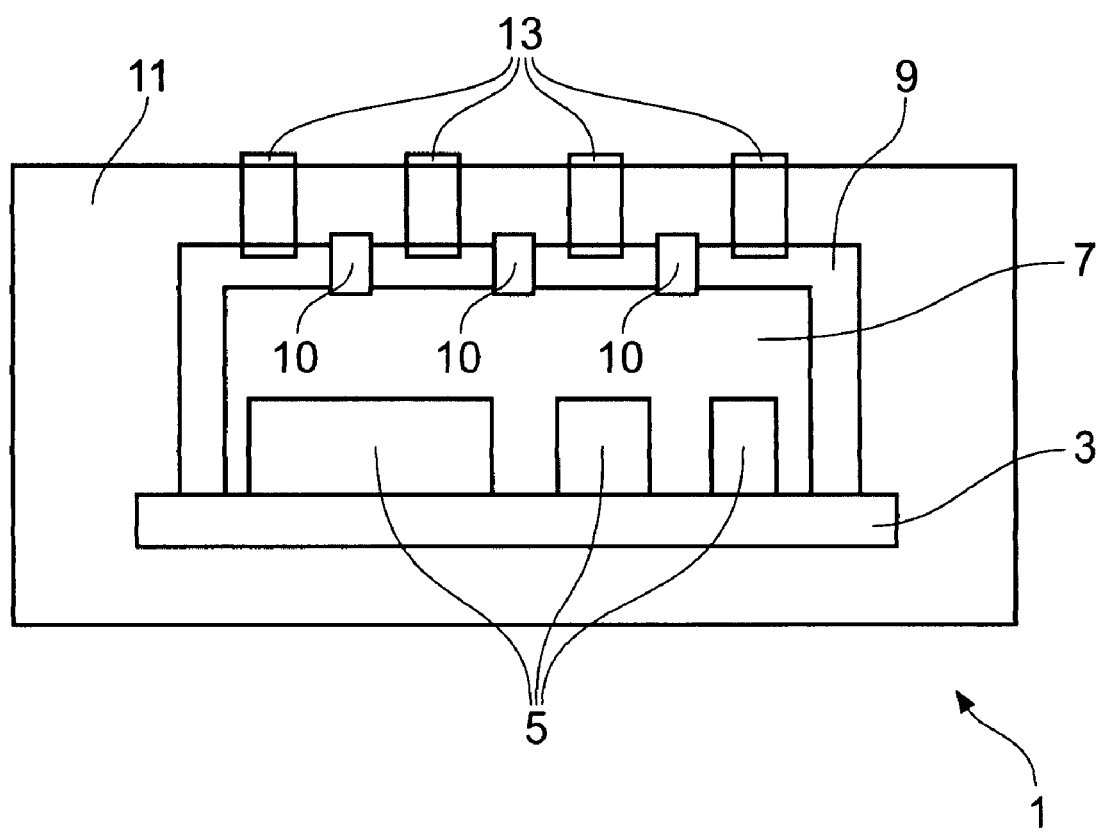
FIG. 1 illustrates a cross section through an electronic device comprising an embodiment of the invention.

FIG. 1 illustrates a cross section through an electronic device 1 according to an embodiment of the invention. The electronic device 1 may be a hand portable electronic device such as, for example, a portable radiotelephone, a personal digital assistant, a digital camera, etc.

The electronic device 1 comprises a printed circuit board (PCB) 3 upon which a plurality of electronic components 5 are mounted. The PCB 3 may also comprise regions upon which no electronic components or circuitry are mounted. These regions can be used to handle the PCB 3 during the process of assembling the device 1. For example, the regions may be used to hold the PCB 3 in position in a mold during injection molding.

The electronic components 5 may, for example, comprise a processor module, an LCD display module or any other electronic component required for the electronic device 1.

Also mounted on the PCB 3 in this particular device 1 is an electromagnetic shield 9. The electromagnetic shield 9 encloses the electronic components 5 and protects them from electromagnetic interference which may come from other electronic components.

In the illustrated embodiment the electromagnetic shield 9 comprises a plurality of holes 10 in the top of the shield 9. In other embodiments the electromagnetic shield 9 may comprise a single hole through which the protective layer 7 can be formed.

The shield 9 is made of a material which is electrically conductive but mechanically rigid. Suitable materials include stainless steel or nickel silver.

The electronic device 1 also comprises a protective layer 7 which overlays and is in contact with the electronic components 5. In the illustrated embodiment the protective layer is contained within the electromagnetic shield 9.

The protective layer 7 is electrically insulating. In some embodiments the protective layer 7 may also be thermally conductive. In such embodiments the protective layer 7 may be made of any material that has a good thermal conductivity but is electrically insulating. For example, the protective layer may be made of material having a coefficient of thermal conductivity greater than 1 W/mK but is electrically insulating so as to avoid any short circuits being created. However the precise properties required may depend on a number of factors including the sensitivity of the electronic components 5 and the thickness of the protective layer 7.

Suitable materials include, for example, resins such as ceramic or epoxy resins, urethane, silicone or composites of any such materials. In one particular embodiment the protective layer 7 may comprise an aluminium nitride (AlN) ceramic filler in an epoxy matrix. This has a coefficient of thermal conductivity of 1.7 W/mK and is electrically insulating In the embodiment illustrated in FIG. 1 the protective layer 7 overlays the entirety of the electronic components 5. In other embodiments the protective layer may only cover a part of the components 5. For example, an electronic component 5 may have a first portion which is more perceptible to damage than a second portion in which case it may only be necessary to have the protective layer 7 overlaying the first portion.

Also, in the embodiment illustrated in FIG. 1 there are a plurality of electronic components 5 mounted on the PCB 3 and the protective layer overlays all of the components 5. In other embodiments where there are a plurality of electronic components 5, the protective layer 7 may overlay only some of the components. For example, it may only be necessary to have the protective layer 7 covering the most sensitive components.

The electronic device 1 also comprises a layer 11 of injection molded material which overlays the electronic components 5 and the protective layer 7. In the illustrated embodiment the injection molded material also overlays and is in contact with the electromagnetic shield 9.

The injection molded material may comprise a plastic or any other material which can be injection molded.

In the illustrated embodiment the injection molded layer surrounds the entire cross section of the PCB 3. In other embodiments the layer may only surround a portion of the PCB 3, for example, the layer may only cover the side of the PCB 3 which has the electronic components 5 mounted on it.

In the illustrated embodiment the layer 11 of injection molded material comprises a plurality of holes 13. The plurality of holes 13 reduce the likelihood of the electronic components 5 overheating during operation of the device 1.

The layer 11 of injection molded material forms a cover for the electronic device 1. The layer 11 may be waterproof and resistant to mechanical shocks so as to protect the electronic components 5 from environmental damage.

The layer 11 of injection molded material may form the external cover of the device 1. Alternatively the electronic device 1 may be part of a further electronic device and be housed within a further casing. The further casing may act to provide further protection for the electronic device 1.

Figure 2:
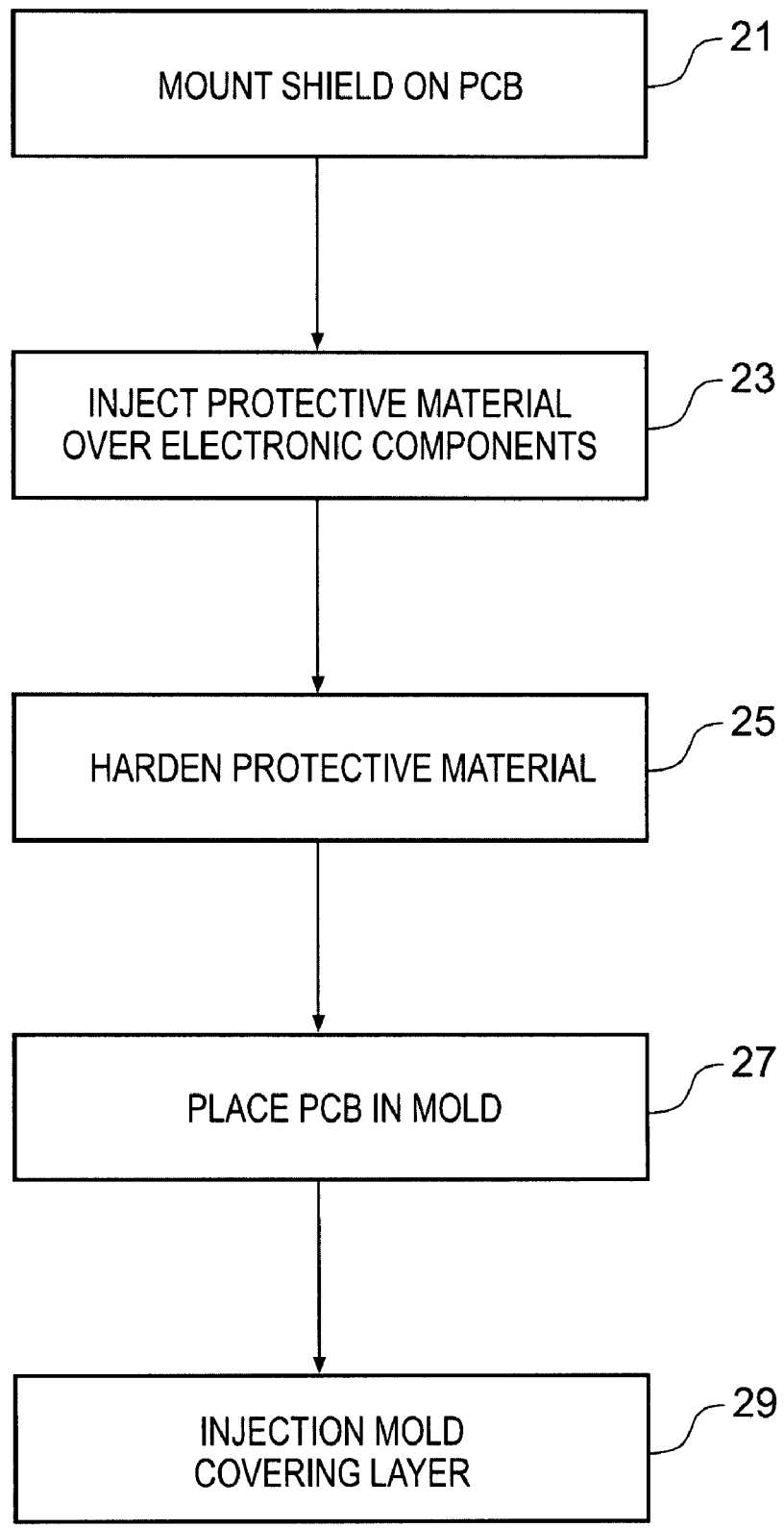
FIG. 2 is a flow chart illustrating the steps of a method of assembling an electronic device according to a first embodiment of the invention.

FIG. 2 illustrates a method of assembling an electronic device 1 according to a first embodiment of the invention.

At step 21 the electromagnetic shield 9 is mounted on the PCB 3 around the electronic components 5.

The electromagnetic shield 9 is mounted to the PCB 3 so as to form a continuous seal between the PCB 3 and the shield 9 thereby preventing leakage of the protective layer 7 during the assembly of the electronic device 1. For instance the shield 9 may be soldered to the PCB 3.

The protective layer 7 is formed, at step 23, by injecting a liquid into the enclosure formed by the shield 9 over the electronic components 5. The liquid may be injected though the holes 10 in the shield 9.

In some embodiments the liquid from which the protective layer 7 is formed has a high viscosity to ensure that it covers and attaches to all components 5 within the enclosure.

In some embodiments the liquid from which the protective layer 7 is formed may be added at lower temperatures and with less force than required for injection molding so as to avoid damaging the electronic components 5.

At step 25 the liquid is hardened to form a solid protective layer 7. The liquid may be hardened by any suitable process for example, where the protective layer 7 comprises a ceramic resin the resin may be cured by heating. In embodiments where the layer is cured by heating the PCB 3 may be thermally conductive so as to prevent the electronic components 5 overheating. Alternatively the temperatures required for curing may be much lower than those required for injection molding and may not damage the electronic components 5.

In other embodiments the protective layer 7 may be cured by a different process, such as, UV curing or two-component thermosetting.

Once the protective layer 7 is hardened, the PCB 3 is positioned in a mold, at step 27, then, at step 29, a cover of the electronic device 1 is formed by injection molding a layer 11 over the electronic components 5 and the protective layer 7.

The electronic components 5 are protected from damage during the injection molding step 29 by the protective layer 7.

In some embodiments the protective layer is thermally conductive, thus when the hot injection molded material makes thermal contact with the protective layer 7 the heat is dispersed through the layer thereby protecting the electronic components 5 from thermal shocks and localized hot spots which may damage sensitive components 5.

The protective layer 7 may also absorb the impact of the material during injection molding thereby protecting the components 5 from mechanical as well as thermal shocks.

Therefore, because the protective layer 7 protects the components from damage caused during injection molding, the injection molded layer 11 can be formed much closer to the components 5 than in prior art devices. In the illustrated embodiment the injection molded layer 11 is formed overlaying and in direct contact with the electromagnetic shield 9. As the separation between the electronic components 5 and the injection molded layer 11 is reduced, this reduces the overall thickness of the electronic device 1.

In embodiments where the protective layer 7 is thermally conductive, the protective layer 7 may also prevent the electronic components 5 from overheating in use as heat generated by the component 5 will be conducted away from the component 5.

Figure 3:
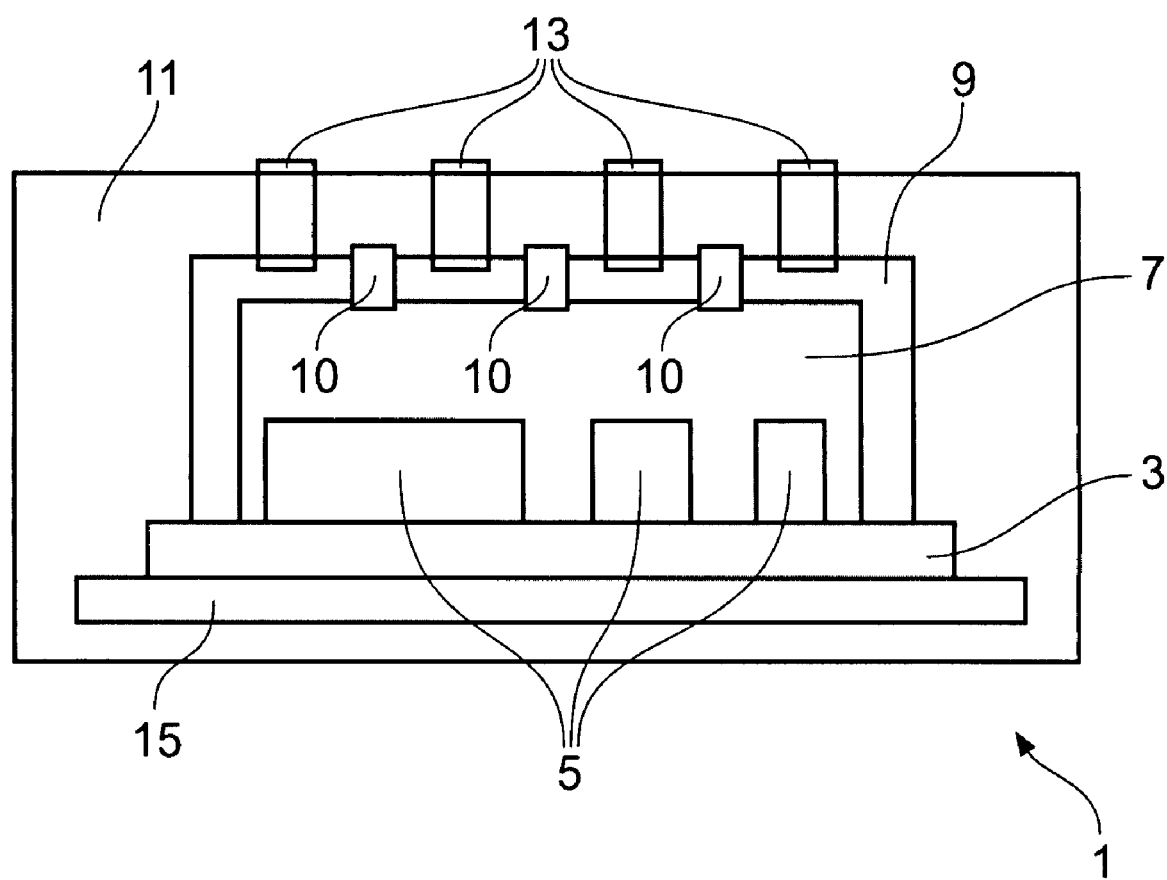
FIG. 3 illustrates a cross section through an electronic device comprising a second embodiment of the invention.

FIG. 3 illustrates a cross section through an electronic device 1 according to a second embodiment of the invention. As in the above described embodiment the electronic device 1 comprises a PCB 3, a plurality of electronic components 5 and an electromagnetic shield 9 mounted on the PCB 3, a protective layer 7 overlaying the electronic components 5 and a layer of injection molded material 11. However in this second embodiment the electronic device 1 also comprises a rigid substrate 15 upon which the PCB 3 is mounted.

Figure 4:
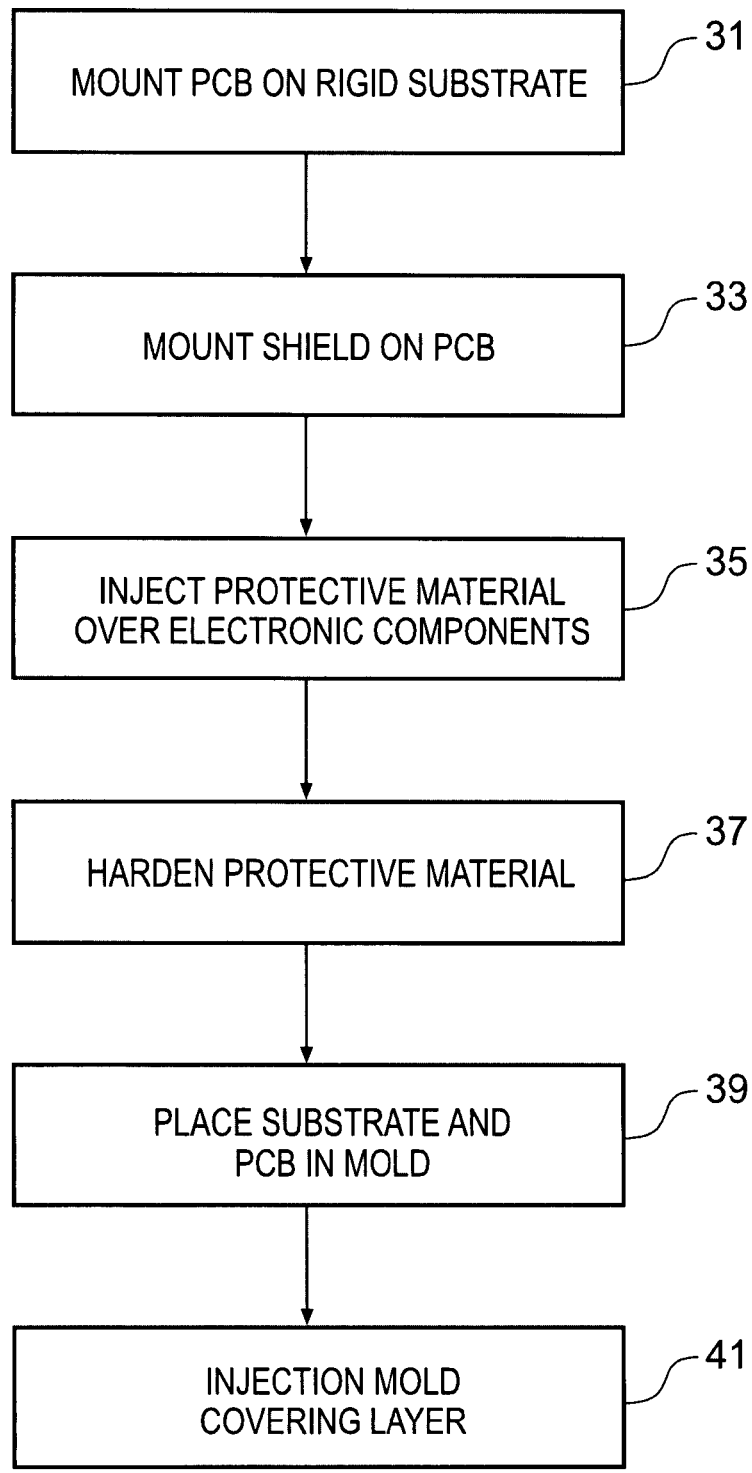
FIG. 4 is a flow chart illustrating the steps of a method of assembling an electronic device according to the second embodiment of the invention.

FIG. 4 illustrates the method steps of manufacturing an electronic device 1 according to the second embodiment of the invention. In this second embodiment the PCB 3 is mounted on the rigid substrate 15 at step 31.

The PCB 3 may be mounted to the substrate 15 by any suitable means. For example the PCB 3 could be adhered to the substrate using a suitable adhesive such as glue or double sided tape. Alternatively the PCB may be mounted to the substrate 15 using mechanical means such as screws or a snap-fit mechanism.

The substrate 15 may be shaped so as to minimize the thickness and weight of the substrate 15 but still provide a strong support for the PCB 3. For example the substrate 15 may be an I or U shaped beam.

The substrate 15 may also be thermally conductive and may act as a heat sink for the electronic components 5. For example, the substrate 15 may be made from a material such as aluminium, stainless steel, magnesium, titanium or a composite of such materials.

At step 33 the shield 9 is mounted to the PCB 3 and at steps 35 and 37 the protective layer 7 is formed by injecting 33 the liquid over the components 5 and the hardening 35 the liquid.

Steps 33 to 37 are analogous to steps 21 to 25 of the first embodiment.

In the embodiment illustrated in FIG. 3 the PCB 3 is mounted 31 on the substrate 15 before the shield 9 is mounted 33 on the PCB 3 and before the protective layer 7 is formed 35. In other embodiments the PCB 3 may be mounted on the substrate 15 after the shield 9 is mounted to the PCB 3 or even after the protective layer 7 has been formed.

At step 39 the PCB 3 and the substrate 15 are located in a mold and then at step 41 the injection molded layer 11 is formed over the PCB 3 and the substrate 15 thus the substrate 15 forms part of the mechanical structure electronic device 1.

The substrate 15 provides a mechanical support to the PCB 3 and electronic components 5 during injection molding 39. Also, in embodiments where the substrate 15 is thermally conductive the substrate 15 acts as a heat sink and prevents the components from overheating during injection molding and in use.

Figure 5:
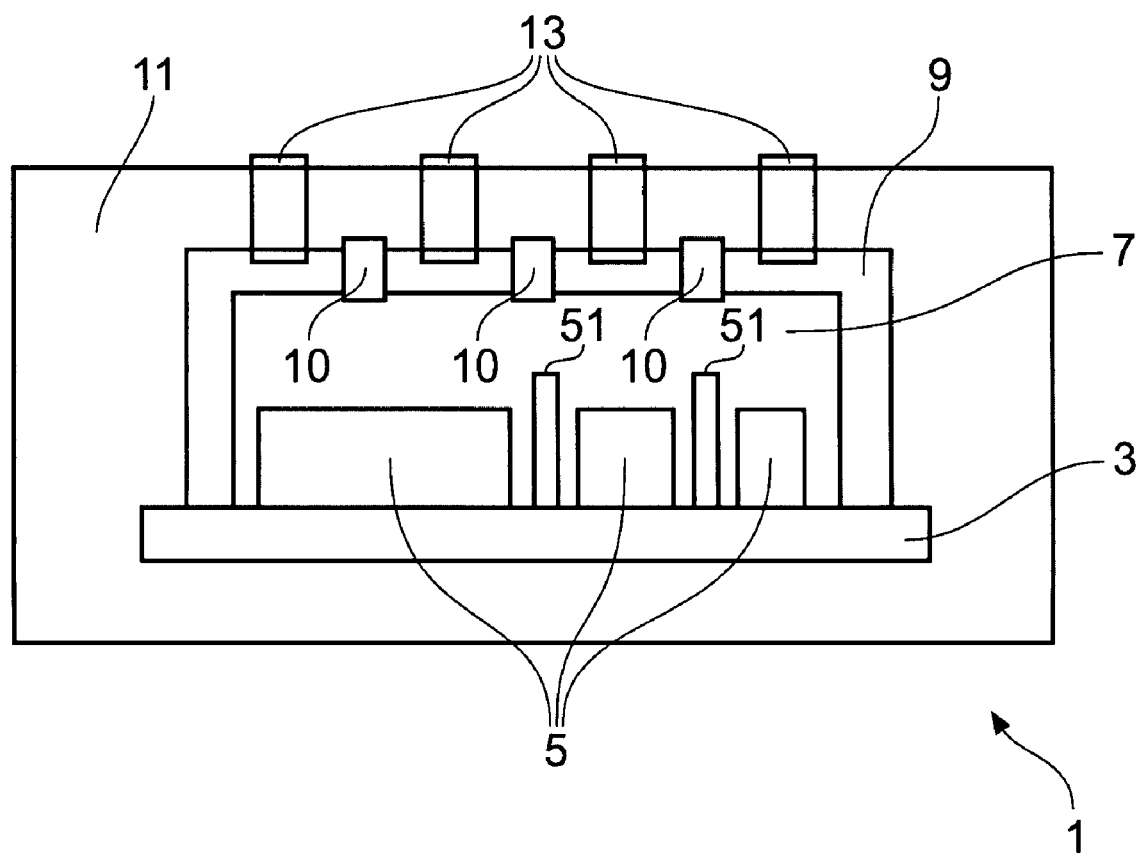
FIG. 5 illustrates a cross section through an electronic device comprising a third embodiment of the invention.

FIG. 5 illustrates an electronic device 1 according to a third embodiment of the invention. As in FIGS. 1 and 3 the electronic device 1 comprises a PCB 3, a plurality of electronic components 5 and an electromagnetic shield 9 mounted on the PCB 3, a protective layer 7 overlaying the electronic components 5 and a layer of injection molded material 11. In the third embodiment the device 1 also comprises a frame 51 which is mounted on the PCB in between the electronic components 5. The protective layer 7 is formed over the electronic components 5 and the frame 51.

The frame 51 may provide some protection to the electronic components during the assembly of the device 1. For example, the frame 51 may act to absorb some of the pressure and/or heat during the formation of the injection molded layer 11.

The frame 51 may be made of any material having suitable properties to absorb heat and/or provide protection from the pressure. For example, the frame 51 may be made of any material such as metal, ceramic, plastics or silicone etc. In one particular example the frame may be made of Kevlar or carbon fiber.

The dimensions of the frame 51 may depend on a number of factors including the sensitivity of the electronic components 5, the material from which the frame 51 is made and the injection molding conditions, i.e. the temperature of the molten material when it is injected into the mold, and the force with which the molten material enters the mold.

In the illustrated embodiment the frame 51 extends further from the PCB 3 than any of the electronic components 5. In other embodiments the frame may extend for the same distance as the electronic components 5 or less than the electronic components 5.

Also in the illustrated embodiment the frame 51 is narrower than the gap between the electronic components 5. In other embodiments the frame 51 may be as wide as the gap between electronic components 5 so that it fills the gap between them. In such embodiments the frame 51 is electronically insulating so as to prevent any short circuits being created between the electronic components 5.

The frame may be attached to the PCB 3 by any suitable means. For example 51 the frame may be adhered to the PCB 3 using an adhesive, or the frame 51 may be soldered to the PCB 3. The means used to mount the frame 51 to the PCB 3 may depend on the material used for the frame 51.

In embodiments where the electronic device comprises a plurality of electronic components 5 the frame 51 may surround all of the electronic components 5 or just a selection of the electronic components 5. In some embodiments the frame 51 may extend around the entire perimeter of the electronic components 5 while in other embodiments the frame 51 may extend around only a section of the perimeter of the electronic components 5.

In the above described embodiments the electromagnetic shield 9 acts as a frame and contains the viscous material during formation of the protective layer 7. In some embodiments the electronic components 5 may not require an electromagnetic shield 9. In which case a removable frame may be attached to the PCB 3 enclosing the electronic components 5 before the viscous material is injected over the components 5. The removable frame ensures that only the components intended to be covered are covered. The removable frame would then be detached from the PCB 3 before the injection molding step 27.

The removable frame may be attached to the PCB 3 by any suitable method which forms a seal between the PCB 3 and the frame and prevents leakage of the protective layer 7 during assembly of the electronic device 1 but allows the frame to be removed once the protective layer 7 has been formed. For instance the PCB may be placed in a pressurized container during the formation of the protective layer 7 so that a hermetic seal is created between the frame and the PCB.

In embodiments where there is no electromagnetic shield 9 the injection molded layer 11 may overlay and be in direct contact with the protective layer 7.

In some embodiments the protective layer 7 may be thermally insulating. In such embodiments the protective layer 7 will protect the electronic components 5 from the heat of the injection molding process. A thermally insulating protective layer 7 may also protect the electronic components from overheating during hardening of the layer 7 by heat curing.

In embodiments where the protective layer 7 is thermally insulating the PCB 3 may be thermally conductive or may comprise a heat sink to prevent the electronic components 5 from overheating in use.

In some embodiments pressurized gas may be added to the injection molding material during the injection molding step 29, 41. This allows for the formation of 3D patterns on the surface of the injection molded layer 11.

In the above described embodiments the electronic components 5 are only mounted on one side of the PCB 3. In other embodiments there may be electronic components 5 mounted on both sides of the PCB 3. Some or all of the electronic components 5 may be covered by a protective layer 7 and injection molded layer 11 as described above.

In the illustrated embodiments the injection molded layer 11 comprises a plurality of holes 13. In other embodiments there may be no holes in the layer 13. For example, in some embodiments these holes may not be necessary for ventilation or, if the injection molded layer is the outer cover of the device 1 it may be considered more aesthetic not to have any holes.

Although embodiments of the present invention have been described in the preceding paragraphs with reference to various examples, it should be appreciated that modifications to the examples given can be made without departing from the scope of the invention as claimed. For example, rather than forming the protective layer over the electronic components, the protective layer may be formed from a pre-molded layer which is then attached to the PCB.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A device comprising:
    an electronic component;
    an electrically insulating protective layer overlaying and in contact with at least a portion of the electronic component; and
    injection molded material overlaying at least the portion of the electronic component and the overlaying protective layer wherein the electrically insulating protective layer is arranged to protect the electronic component during injection molding of the overlaying injection molded material.

2. The device as claimed in claim 1 wherein the electrically insulating protective layer is also thermally conductive.

3. The device as claimed in claim 1 wherein the electrically insulating protective layer comprises a ceramic resin.

4. The device as claimed in claim 1 wherein the electrically insulating protective layer is housed within a protective shield.

5. The device as claimed in claim 1 wherein the electronic component is mounted on a substrate.

6. The device as claimed in claim 5 wherein the substrate acts as a heat sink during injection molding.

7. The device as claimed in claim 5 wherein the substrate forms part of the mechanical structure of the device.

8. A method comprising:
    forming an electrically insulating protective layer over at least a portion of an electronic component, wherein the electronic component is mounted on a first side of a printed circuit board, and wherein the electrically insulating protective layer overlays and is in contact with at least the portion of the electronic component and at least a portion of the first side of the printed circuit board; and
    forming a molded layer over at least the portion of the electronic component and the overlaying protective layer by injection molding, wherein the molded layer is in contact with another different side of the printed circuit board.

9. The method as claimed in claim 8 wherein the electrically insulating protective layer protects the electronic component during injection molding.

10. The method as claimed in claim 8 wherein the electrically insulating protective layer is also thermally conductive.

11. The method as claimed in claim 8 wherein the electrically insulating protective layer comprises a ceramic resin.

12. The method as claimed in claim 8 wherein forming the electrically insulating protective layer comprises at least partially covering the electronic component in a viscous ceramic resin and then curing the resin.

13. The method as claimed in claim 12 wherein forming the electrically insulating protective layer comprises surrounding at least a portion of the electronic component with a frame and injecting the viscous ceramic resin into the frame.

14. The method as claimed in claim 8 comprising mounting the electronic component on a substrate before injection molding.

15. The method as claimed in claim 14 wherein the substrate acts as a heat sink during injection molding.

16. The method as claimed in claim 14 wherein the substrate forms part of the mechanical structure of the electronic device.

17. The method as claimed in claim 14 wherein the substrate is an aluminium I beam.

18. A method comprising:
    mounting an electromagnetic shield to a printed circuit board;
    forming an electrically insulating protective layer between the electromagnetic shield and the printed circuit board, wherein the electrically insulating protective layer is in contact with the printed circuit board and the electromagnetic shield;
    attaching the printed circuit board to a substrate;
    injection molding over the printed circuit board;
    wherein the substrate forms part of an electronic device.

19. The method as claimed in claim 18 wherein the substrate provides mechanical support to the printed circuit board during injection molding.

20. The method as claimed in claim 18 wherein the substrate acts a heat sink during injection molding.

* * * * *